United States Patent [19]

Krause et al.

[11] Patent Number: 4,710,403

[45] Date of Patent: Dec. 1, 1987

[54] METALLIZED POLYMERS

[75] Inventors: Larry J. Krause; Jack A. Rider, both of Stillwater, Minn.

[73] Assignee: Minnesota Mining and Manufacturing Company, St. Paul, Minn.

[21] Appl. No.: 859,471

[22] Filed: May 5, 1986

[51] Int. Cl.[4] .............................................. B05D 3/10
[52] U.S. Cl. .................................. 427/304; 427/123; 427/443.1
[58] Field of Search ..................... 427/306, 443.1, 304, 427/322, 123

[56] References Cited

U.S. PATENT DOCUMENTS

| | | | |
|---|---|---|---|
| 4,459,330 | 7/1984 | Krause | 427/443.1 |
| 4,512,855 | 4/1985 | Mazur | 204/22 |
| 4,617,204 | 10/1986 | Haushalter | 427/306 |

OTHER PUBLICATIONS

Pickup, P. G. et al, "Electrodeposition of Metal Particles and Films by a Reducing Redox Polymer", J. Electrochem. Soc., vol. 130, No. 11 (Nov. 1983) pp. 2205-2216.

Haushalter, R. C. et al, "Electroless Metallization of Organic Polymers Using the Polymer as a Redox Reagent: Reaction of Polyamide with Zintl Anions", Thin Solid Films, vol. 102 (1983) pp. 161-171.

Ho, P. S. et al, "Chemical Bonding and Reaction at Metal/Polymer Interfaces", J. Vac. Sci. Technol., vol. 3, No. 3 (May/Jun. 1985) pp. 739-745.

Chemically Modified Electrodes, Murray, pp. 297-298.

*Primary Examiner*—John E. Kittle
*Assistant Examiner*—Terry J. Owens
*Attorney, Agent, or Firm*—Donald M. Sell; James A. Smith; Mark A. Litman

[57] ABSTRACT

Formation of well-adhered metal layers on aromatic polymeric substrates through a two-step process is based upon reversible charge storage in the electroactive center-containing polymeric substrate. Articles particularly useful for electronic, imaging and solar applications are produced. The process disclosed may be a totally additive process such that articles can be produced in a continuous manner.

39 Claims, No Drawings

METALLIZED POLYMERS

BACKGROUND OF THE INVENTION

Metallized organic polymers are utilized in numerous applications requiring conductive or reflective coatings. The primary methods for the metallization of the polymers have been vapor deposition (evaporation and sputtering) and standard or conventional electroless deposition techniques. Metallized films of polyimides (PIm) are particularly desirable in the fabrication of large-scale integrated circuits (the polyimide being primarily used as an insulating dielectric layer), flexible printed circuitry, and photovoltaic devices (primarily as a flexible substrate which can withstand the temperatures associated with the deposition of amorphous silicon).

A major concern in metallizing polyimide films, particularly for electronic applications, is the adhesion of the metal film to the polymeric substrate. It is necessary that the metal film stay well-adhered to the polymer during and after processing, which often involves electroplating and selective etching of metal film off the substrate by strong acids. This processing can lead to undercutting of metal film and loss of adhesion. Perhaps the most popular method of achieving well-adhered copper films on polyimide today is done by sputtering techniques. In this process, chromium is sputtered in the presence of oxygen onto the polyimide substrate and then copper is sputtered onto this "primed" substrate. It has been claimed that this pre-sputter with chrome in the presence of oxygen results in the covalent bonding of the chrome oxide layer to the substrate. This covalent bonding mechanism may be subject to hydrolysis reaction and may generally be expected to show reduced persistence after exposure to ambient conditions.

U.S. Pat. No. 4,459,330 discloses an electroless plating process for plating at least one main group metal on a surface of an aromatic polyimide substrate comprising the steps of forming a nonaqueous solution containing a Zintl complex, a salt or alloy of an alkali metal in a positive valence state and at least one polyatomic association of a main group metal in a negative valence state, the polyatomic main group metal being selected from the group consisting of Ge, Sn, Pb, As, Sb, Bi, Si and Te. An aromatic polymeric substrate is chosen which is reducible by the solubilized salt and is resistant to degradation during the reaction. A redox reaction is effected between the salt in solution and the substrate by contacting the solution with the substrate for a sufficient time to simultaneously oxidize and deposit the main group metal in elemental form to produce a plated substrate. The alkali metal is retained in the plated substrate, and the substrate becomes negatively charged by electrons transferred from the main group metal during the redox reaction. Only polyatomic complexes of at least seven atoms are shown.

Haushalter and Krause (Thin Solid Films, 102, 1983, 161–171 "Electroless Metallization of Organic Polymers Using the Polymer As a Redox Reagent: Reaction of Polyimide with Zintl Anions") extended the polyimide metallization discussed above to certain transition metals by using the PIm as a reducing agent toward an oxidized metal species in solution. Specifically, the treatment of PIm with methanol solutions of Zintl salts, e.g., salts of $K_4SnTe_4$ provides a reduced intercalated material, $K_x$ PIm, with no surface metallization. The reaction of $K_x$ PIm with solutions of transition metal cations with reduction potentials more positive than that of $K_x$ PIm results in metal deposition.

The metal films deposited by this method show varied properties depending on the element and amounts deposited. For example, reaction of $K_x$ PIm with $Pt^{2+}$ or $Pd^{2+}$ in dimethylformamide (hereinafter DMF) rapidly gives uniform highly reflective films with conductivities approaching that of the bulk metal. In contrast, $Ag^+$ ions, noted for their high mobility in solids, give films with resistances several orders of magnitude higher than that of palladium films containing similar amounts of metal. Apparently, the $Ag^+$ ions can diffuse into the solid at a rate roughly comparable with the diffusion rate that the $K^+$ and electrons exhibit in moving to the surface of the polymer (the rate of charge propogation towards the surface). The polymer is therefore partially metallized throughout the bulk solid.

Attempts to apply the above prior art to accomplish metallization of polyimide using oxidizing solutions of $CuCl_2.2H_2O$ in methanol or DMF resulted in failure. Accordingly, one aspect of the invention is a process for plating metals, and particularly transition metals, on polymeric films having electroactive centers therein, especially polyimide surfaces. A further aspect of the invention is to produce useful metallized polymeric imidecontaining substrates. Still a further aspect is to plate transition metals on polyimide having a varied thickness, and still a further object is to provide a totally additive plating process and images produced by that process.

SUMMARY OF THE INVENTION

A metallization process is utilized for diffusing metals into the surface of a polymeric substrate having electroactive centers and subsequently plating a metal to a desired thickness. A charge is first injected and reversibly stored in the polyimide, which charge is subsequently used for the reduction and deposition of transition metal in elemental form. A significant advance in the practice of the invention is embodied in the preparation and use of aqueous or methanolic solutions to carry the chemical reducing agent for polyimide and in the use of monoatomic ions or complexed transition metal ions capable of reducing an electroactive center in the polymer.

DETAILED DESCRIPTION OF THE INVENTION

The basic process of the present invention comprises the injection of electrons into a polymer containing electroactive centers without the coincident deposition of a metal film on or in the surface of the polymer and the subsequent reduction of metal ions in solution by the transfer of electrons from the polymer to the metal cations causing the formation of metal in or on the surface of the polymer. The deposited metal is then used as a site for further deposition of metal by reduction of metal cations. The improvement of the present process over the prior art in part resides in the fact that it is not necessary to use exotic Zintl complexes and Zintl anions to inject the charge into the polymer. It is preferred that no Zintl complexes or anions be used in the practice of the present invention. The present invention should at least use some amount of simple or complex ions which can be used to inject charges into the polymer as a partial or total replacement for the expensive and difficult to manufacture Zintl complexes and anions. For example, the injection solutions should comprise at least ten molar percent of monoatomic negative charge intercalation ions out of the total molar amount of negative charge intercalation ions. This percentage is preferably at least 25%, more preferably 60%, highly preferred as at least 90% and most preferred as at least 98% or 100% of monoatomic negative charge intercalation ions. The most preferred negative charge intercalation ions are $Te^{2-}$, V(ethylenediaminetetraacetic acid)$^{2-}$, and Co(bipyridyl)$_3{}^{30}$ which are conveniently provided as $M_xTe^{2-}$(wherein M is an alkali metal cation and x is the value of 2 divided by the valence state of the cation) or produced by the electrochemical reduction of tellurium and as further shown in the Examples.

After injection of the charge into the electroactive centers of the polymer substrate without substantial surface metallization (that is, less than 50Å of deposition, preferably less than 25Å of deposition, most preferably zero deposition by weight and volume), the activated polymer may now be contacted with solutions of metal salts, particularly transition metal salts, to cause deposition of the metal. As subsequently pointed out, the choice of the metal can determine the depth of the initial deposition, with highly migratory metal cations being capable of reduction at depths of up to about 4 microns. As the charge is exhausted, the depth of penetration will be reduced until substantially only surface deposition will occur, but at that point, conventional electroless (or other) deposition may be used to further thicken the metal layer.

The inventive electroless process for plating transition metals on a polymeric substrate having electroactive centers (e.g., polymeric films containing imide groups in the polymer network, e.g., polyimide [PIm], pyromellitimide) is accomplished in a two-step process. First, by taking advantage of the oxidation states of the simple ions or transition metal complexes and the alkali metal cations and small quaternary ammonium cations (e.g., tetramethyl ammonium) permeability of PIm, it is possible to reduce the polymer without surface metal deposition. second, the reduced solid is then used to deposit transition metal cations reductively from solution.

For example, the reduced, deeply green-colored alkali metal or quaternary ammonium cation diffused monoanion polyimide is prepared by immersion of the film in aqueous or methanolic reductants. The time of immersion varies from a few seconds up to several hours depending upon the extent of reaction desired. Along with the reduction of the polyimide film is the concomitant diffusion of the counter cation into the film. The size of the counter cation appears to be very important. Alkali metals freely diffuse into the film as reduction proceeds. Intermediate sized quaternary ammonium cations such as tetramethylammonium and tetraethylammonium do diffuse into the polyimide film and reduction of the film to produce a deeply colored radical anion film occurs. However, the ammonium cation appears unstable as the counter cation. This is indicated by a gradual fading of the film color to lighter shades of green.

Polyimide reduction with $Te^{2-}$ is best accomplished in methanol, although the halfwave potentials (E1/2) for the oxidation of $Te^{2-}$ in water or methanol are essentially the same. The differences in reducing polyimide in water, as opposed to methanol, appear to arise from the inability of the water solutions to adequately wet the polymer and facilitate rapid electron transfer. Reduction of polyimide using aqueous $Te^{2-}$ is generally a much slower reduction step and can produce inhomogeneous results. Surfactants added to these aqueous $Te^{2-}$ solutions have reduced the inhomogeneity.

Alternately, it has been discovered that polyimide film reduction without the formation of metal surface layers can be accomplished using complexed vanadium (V[II]) or complexed cobalt (Co[I]) species in aqueous or methanolic based systems as shown in Table I below.

TABLE I

| Reductant | $E_{\frac{1}{2}}{}^{(a)}$ | Supporting Electrolyte | pH |
|---|---|---|---|
| V[II]EDTA$^{2-(b)}$ | $-1.27$ V$^{(r)}$ | 0.1 M Na$_2$ClO$_4$ | 8.5 |
| V[II](Ox)$_x{}^{-y(c)}$ | $-0.88$ V$^{(r)}$ | 0.5 M K$_2$Ox | 7.7 |
| V[II](NTA)$_x{}^{-y(d)}$ | $-0.75$ V$^{(r)}$ | 0.1 M K$_2$NTAH | 9.4 |
| V[II]EDTA$^{2-}$ | $-1.40$ V$^{(r)}$ | 0.1 M KI | — |
| Co[I](Bpy)$_3{}^+$ | $^{(r)}$ | 0.1 M NaI/MeOH | — |

$^{(a)}$Obtained polarographically at dropping mercury electrode
$^{(b)}$EDTA = ethylenediamine tetra-acetic acid, tetraanion
$^{(c)}$Ox — oxalate (C$_2$O$_4{}^=$)
$^{(d)}$NTA = nitrilotriacetic acid, trianion
$^{(r)}$r = reversible
$^{(e)}$Bpy = 2,2'-dipyridyl
x and y represent whole integers The reductants are easily regenerated electrochemically by applying a suitable potential to the solution. This makes possible the use of a closed loop system for the reduction of polyimide. Only electrolyte need be added to the system to make the film reduction continuous. Additionally, no special environmental problems are encountered in the use of this system. Films of copper, cobalt, cobalt/phosphorous alloy, gold and nickel were deposited on polyimide film when any of the vanadium reductants in Table I were used.

It is believed that polymers having electroactive sites of the appropriate standard reduction potentials such as aromatic polyimides, polysulfones and copolymers of styrene and vinyl pyridine would provide favorable results. In view of the increased rates of the redox reaction and platings produced on the aromatic polyamides and polysulfones, the presence of electron-withdrawing groups are preferred adjacent to the aromatic ring either in the polymeric backbone or as substituents. Accordingly, suitable polymers include aromatic polyimides, polyamides, polysulfones, styrene polymers with vinyl pyridine, substituted styrene polymers with electron-withdrawing groups and other polymers with the above characteristics. The preferred polymers include the polyimides and polysulfones.

Advantageously, the polymers include electronwithdrawing groups in the backbone or as substituents on the aromatic groups. Illustrative of those in the backbone are carbonyl and sulfonyl groups while the groups substituted on the aromatic groups may include nitrile, thiocyanide, cyanide, ester, amide, carbonyl, halogen and similar groups.

As is known, aromatic polyimides may be illustrated by the following

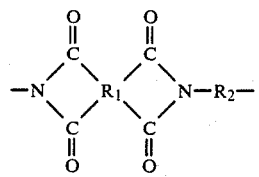

where $R_1$ and $R_2$ are single or multiple aromatic groups. Polysulfones may be illustrated by the following:

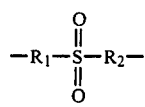

where $R_1$ and $R_2$ represent single and multiple aromatic groups as in

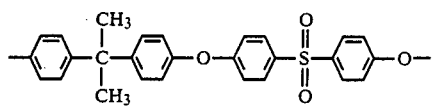

In the copolymeer of styrene and vinyl pyridine, the general repeating units are

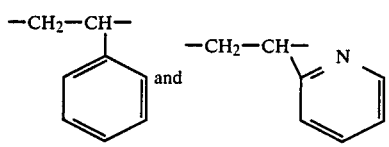

Polyimide films, particularly those containing pyromellitimide centers are the preferred substrates in the present invention because of their excellent thermal and dielectric properties as well as their chemical resistance and dimensional stability. Also films containing pyromellitimide units therein to act as electroactive centers are useful. The polymers may contain pyromellitimide units through copolymerization, block copolymerization, graft copolymerization or any of the other known methods of combining polymer units. Other polymer units which provide electroactive centers (variously known as redox centers and charge transfer centers) may also be used as the polymeric substrate.

An important factor in the diffusion and formation of the metal layer is a favorable free energy for the reaction of radical anion polyimide film and a particular metal cation. This is clearly the case for most copper salts. The reduction potential of the copper salts is dramatically affected by a change in the solvent or coordination sphere of the ion. Variation of the reduction potential provides a means of controlling the reaction between the metal ion and the polyimide film. In general, the more negative the free energy of the reaction between a metal cation and reduced polyimide film, the faster the metal film is formed. The rate at which a metal is deposited has considerable affect upon the properties of the deposit. Also important for the oxidation of the polyimide film is the size of the oxidizing species which does not necessarily have to be cationic. Thus oxidation of $PIm^{-1}$ by $Ag^+$ can result in finely dispersed polycrystalline silver metal deep within the polymer (3–4$\mu$m). The presence of dispersed metal particles at depths in excess of 1 micron immediately after deposition of the metal tends to be a unique characteristic of the process of the present invention. In this case, the very small aquated $Ag^+$ diffuses into the film at a rate much greater than the rate of charge propagation out to the film surface. Similarly, the oxidation of $PIm^{-1}$ by $Au(CN)_2^-$ results in the formation of gold metal within the polymer. This oxidation is quite slow as the reduction potential of $Au(CN)_2^-$ is $-600$mv. Alternatively, the oxidation of $PIm^{-1}$ by $AuBr_4^-$ is very rapid and results in primarily highly conductive surface layers of gold metal. A third important consideration in the metallization of polyimide is the pH of the oxidizing solution. At a pH below 7, protonation of the radical anion will occur and inhibit the charge propagation out of the polyimide film. This effect increases at lower pH and can completely inhibit metal layer formation. Although the green color characteristic of the radical anion polyimide film persists at low pH values, surface protonation can be sufficient to totally disable charge transfer to the polymer surface and to affect metallization. For the metallization of polyimide with copper in a copper oxidant, this effect is seen at a pH below 5 and a reaction time of the film and the solution at pH 5 of 1 minute. The polyimide film remains green but copper will not form on the surface of the film. Metallization can occur, to some extent, even at low pH if the rate of metal reduction is sufficiently fast. Under basic conditions, hydroxide mediated electron transfer reduction of $PIm^{1-}$ to $PIm^{2-}$ can also occur, having an effect on the oxidizing specie's ability to diffuse into the film surface.

The half-wave potential of the negative charge intercalation ions should be negative with respect to the half-wave potential of the polymer. By being negative with respect to the half-wave potential of the polymer, it is meant that the negative charge intercalation ion is capable of reducing the polymer. It is preferred that the negative charge intercalation ion be capable of injecting only one electron per charge transfer center, although ions injecting two electrons have been used.

When the oxidant is $Cu(OCOCH_3)_2.H_2O$ in methanol, 1 mg/ml, a brilliant mirror-like copper layer is formed which is electrically conductive. Likewise, when the oxidant is a saturated methanolic solution of CuI with KI (1 g/25 ml), a bright opaque copper film is formed which has conductivity approaching that of the bulk metal. The formation of copper layers through the oxidation of $PIm^{1-}$ is very surprising in view of the fact that when $PIm^{1-}$ is oxidized with $CuCl_2.2H_2O$ in methanol, the characteristic green color of the polyimide film disappears as oxidation proceeds but no copper film is formed. Similarly, when the oxidant is $CuCl_2.2H_2O$ in DMF, no copper metal film is formed. The copper films formed in the above examples are all quite thin films being generally much less than 1 $\mu$m in thickness (e.g., 100–400 Angstroms). For many current carrying applications it is necessary to have thicker coatings of copper metal. This can be accomplished through the redox chemistry of polyimide by using electroless copper solutions described in the examples as the oxidant. The oxidizing copper complex may be Cu(II)EDTA as in Example 3. The reduction of this complex by the polyimide leads to the thin copper film formation and then the catalytic properties of the electroless solution continue to build copper thickness.

Whenever electroless copper oxidants are used, the polyimide reductions may be accomplished by $Te^{2-}$. However, polyimide reduction by the vanadium or cobalt complexes will lead to particularly good quality copper films and is preferred. The formation of nickel films from electroless nickel oxidants has also been accomplished. The composition of the electroless nickel oxidants are given in the examples.

The adhesion of both copper and nickel films is quite good. Tape peel tests with an aggressive tape did not result in failure of the metal/polymer adhesion. Importantly, the adhesion appears to be good even immediately after the film's formation in the electroless oxidants. This promotes processing in a continuous manner when copper thickness is to be increased to 1 mil or greater by electroplating. Peel tests on thick electroplated copper formed by the methods of the prior art have generally resulted in cohesive failure of underlying polyimide. It is commonly observed that the adhesion of metal to polymer increases with time as metal establishes a mechanical anchorage. Copper films deposited upon polyimide through the technique of the present invention were investigated by transmission electron microscopy (TEM) in order to characterize the polymer/metal interface. These investigations show that the adhesion of the film to the polymer is due to a mechanical anchorage of the metal caused by immediate diffusion of the metal complex just within the polymer surface where reduction occurs. Metal builds on top of this diffused region forming the thick, conductive, copper film.

Additional utility realized through this unique metallization process is the ability to deposit metal only where it is desired on the polyimide substrate. The application of water or methanol insoluble ink materials to the polyimide surface before reduction prevents charge transfer to that surface region. This provides an imaging process for printing circuit manufacture which can be a totally additive one. To demonstrate this, arbitrary circuits have been patterned onto polyimide by a high speed offset printing technique using an ink as is given in the examples. The printed polyimide is reduced in the manner described above and then oxidized in electroless copper or nickel. Only the polyimide film surface that has not been covered by the offset print is metallized — no etch is necessary. A standard resolution pattern was also printed onto the polyimide substrate to assess the resolution obtainable through this imaging technique. In general, 2 mil lines and spaces are easily resolvable by this process. The resolution limit observed appears to be limited only to the printing process. Conventional photoresists could be utilized as well for imaging with the resolution obtainable by such systems.

One surprising aspect of the present invention has been found to be the relative importance of the sequence of steps in producing the best bond strengths. Examples have been performed where the film is first reduced, then either oxidized/plated contemporaneously or oxidized to approximately stoichiometry then plated. The bond strengths in the second alternative were often multiples (e.g., two or three times) of the bond strengths of processes with simultaneous oxidation and electroless plating. The best results are obtained when the charged polymer film is oxidized to stoichiometry, that is, all of the charge is used in the oxidation of the film, prior to any deposition of metal by other means. This effect is observable to proportionately lesser degrees as the amount of oxidation prior to further metallization is less than full stoichiometry. However, the effect is believed to be observable when at least 25% of the oxidation is effected by utilization of the stored charge prior to any other type of metallization. Preferably at least 50% of the charge is utilized in the oxidation process prior to any other type of metallization. More preferably 75% of the charge is so used, and still more preferably 95% or 100% of the stored charge is so used prior to any other form of metallization.

Some specific, non-limiting examples follow

EXAMPLE 1

Generally, all reductions and some oxidations were performed in an oxygen-free inert atmosphere such as nitrogen or argon. Most of the operations were conducted in a glove box under an argon atmosphere. In this example 1 g of $K_2Te$, obtained from Cerac Pure, Inc., was dissolved in 100 ml of methanol. Approximately 30 minutes are allowed for the dissolution of the salt. A 75 micron thick strip of an aromatic polyimide (available under the Kapton trademark) was immersed into the solution for about 30 seconds, removed, rinsed in methanol and wiped clean. The resultant deeply green colored polyimide film strip was then ready for metallization.

An oxidizing solution of $Cu(OCOCH_3)_2 \cdot H_2O$ in methanol (500 mg/500 ml) was prepared. The above prepared reduced green colored polyimide film strip was then immersed for 60 seconds in this oxidizing solution. A brilliant mirror-like reflective copper film was obtained. The copper film was thin (partially transparent when held up to the light) and electrically conductive.

EXAMPLE 2

A reduced green radical anion polyimide strip was prepared as in Example 1. An oxidizing solution of KI in methanol (1 g/25 ml) saturated with CuI was prepared. Again, approximately 30 minutes was allowed for the dissolution of the salts. The reduced polyimide strip was immersed for three minutes in this oxidizing solution. A bright opaque copper film was obtained with an electrical conductivity approaching that of the bulk metal.

EXAMPLE 3

A reduced polyimide strip was prepared as in Example 1. An electroless copper oxidizing solution was prepared using 28.5 g/l $CuSO_4 \cdot 5H_2O$ plus 12.0 g/l 37% HCHO plus 50 g/l $Na_2EDTA$ plus 20 g/l NaOH in 175 ml/l methanol/water. The reduced polyimide strip was immersed for five minutes in this oxidizing solution in air. A bright copper deposit approximately 0.5 micron thick with near bulk electrical conductivity was obtained.

EXAMPLE 4

A reduced polyimide strip was prepared as in Example 1. A commercially available (CP-78 Electroless Copper, Shipley Co., Newton, MA) electroless copper solution held at a temperature of 43° C. was utilized. The reduced polyimide strip was immersed for 5 minutes in this oxidizing solution in air. A well-adhered bright copper layer with bulk electrical conductivity was obtained.

EXAMPLE 5

A copper metallized polyimide strip prepared as in Example 4 was electroplated to a thickness of approximately 25 microns in a standard acid copper plating bath. Three parallel strips of plater's tape (3 mm wide) were attached spaced at 6 mm intervals on one side of the electroplated strip to protect the underlying copper from a subsequent acid etch. The entire strip was then immersed into a 30% nitric acid solution and the unprotected copper regions were etched away. The plater's tape strips were then removed leaving three well-adhered copper lines on the polyimide strip.

EXAMPLE 6

A reduced polyimide strip was prepared as in Example 1. An electroless nickel solution was prepared using 21 g/l $NiCl_2.6H_2O$ plus 24 g/l $NaH_2PO_2.H_2O$ and 12 g/l $NH_2CH_2COONa$. The pH of this solution was adjusted to 6.0 with hydrochloric acid. The reduced polyimide was immersed in this oxidizing solution for five minutes. A bright nickel deposit with near bulk electrical conductivity was obtained.

EXAMPLE 7

An aqueous solution was prepared using 0.8 g of $VOSO_4.2H_2O$ and 6.1 g of ethylenediaminetetraacetic acid dipotassium salt dihydrate in 150 ml deionized water. Sufficient KOH was added to dissolve the $K_2EDTA$ salt, the final pH being approximately 8–9. This solution was electrolyzed at a mercury pool cathode at $-1.4$ V versus a Ag/AgCl reference electrode until most of the vanadium had been reduced to the $V^{2+}$ oxidation state as evidenced by a reduction in the amount of current flowing to approximately less than ten percent of the beginning current level. A platinum helix contained in a separate fritted compartment containing aqueous KI solution was used as the counter electrode.

A 75 micron thick strip of an aromatic polyimide (available under the Kapton trademark) was immersed into the solution prepared above for about 30 seconds, removed and wiped dry. The resultant deeply green colored polyimide strip was metallized as in Example 1.

EXAMPLE 8

An aqueous solution was prepared using 1.2g of $VOSO_4$ and 8.76g of ethylenediaminetetraacetic acid in 300ml of deionized water. Solid tetramethyl ammonium hydroxide was added to solubilize the ingredients and adjust the final pH to between 7 and 10. This solution was electrolyzed at a mercury cathode pool at $-1.4$ V versus a Ag/AgCl reference electrode to accomplish the reduction of V(IV) to V(II). A platinum helix contained in a separate fritted compartment containing aqueous tetramethyl ammonium ethylenediaminetetraacetate (0.1M) was used as the counter electrode.

A 75 micron thick strip of an aromatic polyimide (available under the Kapton trademark) was immersed into the solution prepared above for about 60 seconds, removed and rinsed in water. The resultant deeply green colored polyimide strip was metallized as in Example 1.

EXAMPLE 9

An aqueous solution was prepared using 0.4 g $VOSO_4.2H_2O$ plus 1.66 g $K_2C_2O_4.H_2O$ in 100 ml of deionized water. Sufficient KOH was added to adjust the pH to approximately 7. This solution was electrolyzed at a mercury pool cathode at $-1.4$ V versus a Ag/AgCl reference electrode as described in Example 7.

A 75 micron thick strip of an aromatic polyimide (Kapton ®) was immersed into the solution prepared above for about 30 seconds, removed and wiped dry. The resultant deeply green colored polyimide strip was metallized as in Example 4, except that it was performed in the absence of oxygen.

EXAMPLE 10

An aqueous solution was prepared using a 0.4 g $VOSO_4.2H_2O$ plus 1.9 g of nitrilotriacetic acid in 100 ml deionized water. Sufficient KOH was added to dissolve the nitrilotriacetic acid and to raise the pH to approximately 8. This solution was electrolyzed at a starting voltage of $-1.4$ V and a finishing voltage of $-1.9$ V versus a Ag/AgCl reference electrode as described in Example 7. The final pH was 8.6.

A 75 micron strip of an aromatic polyimide (Kapton ®) was immersed into the solution prepared above for about 30 seconds, removed and wiped dry. The resultant deeply green colored polyimide strip was metallized as in Example 1.

EXAMPLE 11

An arbitrary electronic circuitry pattern was patterned onto 75 micron thick aromatic polyimide film (Kapton ®) by a high speed offset printing technique. The printing ink used was Tough Tex Printing Ink for non-porous surfaces from Vanson Holland Ink Corporation of America. The imaged polyimide film was reduced to the green radical anion color as in Example 1. The film was reduced only in the exposed windows delineated by the masking ink. The reduced film was immersed in 43° C. electroless copper as in Example 4 for five minutes. A well adhered copper printing circuit pattern was obtained.

EXAMPLE 12

Using the offset printing process described in Example 11, 75 micron aromatic polyimide (Kapton ®) was patterned with a standard resolution test pattern. The imaged polyimide film was reduced and metallized as described in Example 11. Two mil lines and spaces were resolvable by this technique and resolution was limited by the clarity of the offset printed image.

EXAMPLE 13

A reduced polyimide strip was prepared as in Example 1. An oxidizing solution of $CoCl_2.6H_2O$ in N,N-dimethylformamide (1.30 g/100 ml) was prepared. The reduced green colored polyimide was immersed for several minutes in this oxidizing solution. A brilliant, mirror-like reflection cobalt film was obtained. The cobalt film was thin (partially transparent when held up to the light) and electrically conductive.

EXAMPLE 14

An electroless cobalt bath was prepared as described in U.S. Pat. No. 3,138,479. The solution was prepared using 25 g/l $CoCl_2.6H_2O$, 25 g/l $NH_4Cl$, 50 g/l $Na_3C_6H_5O_7.2H_2O$, and 10 g/l $NaH_2PO_2.H_2O$. Ammonium hydroxide was used to adjust the pH to approximately 8.5. The bath was heated to 60° C. and the thin cobalt clad polyimide film from Example 13 was immersed in it for several minutes. A cobalt/phosphorous alloy was deposited which has a magnetic coercivity of 450 oersteds.

EXAMPLE 15

An aqueous solution was prepared using 0.4 g $VOSO_4.2H_2O$ plus 3.7 g ethylenediaminetetraacetic acid dihydrate in 100 ml deionized water. Tetramethylammonium hydroxide was added in sufficient quantity to dissolve the $Na_2EDTA$ salt and to raise the initial pH to between 8 and 9. This solution was electrolyzed at $-1.4$ V versus a Ag/AgCl reference electrode as described in Example 7. The final pH was about 9.

A 75 micron thick strip of an aromatic polyimide (Kapton ®) was immersed into the solution prepared above for about 30 seconds, removed and wiped dry. The resultant deeply green colored polyimide strip was metallized as in Example 4, except that it was performed in the absence of oxygen.

EXAMPLE 16

An aqueous solution was prepared using 2 g $VOSO_4 \cdot 2H_2O$ plus 21 g ethylenediaminetetraacetic acid dipotassium salt dihydrate in 400 ml deionized water. KOH was added until the final pH was approximately 9 or greater. At least 1000 ml methanol was added to the blue solution, resulting in the formation of a white precipitate. This solution was filtered and the white precipitate discarded. The filtrate was stripped off by vacuum evaporation, leaving a blue solid. The solid was dissolved in a minimum of methanol, filtered and the solvent removed.

One gram of the dry blue solid was dissolved in 100 ml methanol which was also 0.1 M in a supporting electrolyte, KI. This solution was electrolyzed at a mercury pool cathode at $-1.4$ V versus a Ag/AgCl reference electrode as described in Example 7. The final solution was orange-brown and was used to reduce a strip of Kapton polyimide film by about a 30 second immersion of the film in the solution.

A solution of $AuBr_4^{3-}$ was prepared by dissolving 10 mg of AuBr in 20 ml of 0.1 M aqueous KBr. The above reduced polyimide strip was immersed in this solution for a few seconds resulting in the formation of a conductive gold film on the polymer surface. Higher $Au^{1+}$ concentrations and neutral pH conditions favor and enhance the rate and depth of gold film formation.

EXAMPLE 17

A methanolic solution was prepared using 0.95 g of $CoCl_2 \cdot 6H_2O$ plus 1.87 g of 2,2'-dipyridyl plus 3.0 g NaI in 200 ml of methanol. This solution was electrolyzed at a mercury pool cathode at $-1.3$ V versus a Ag/AgCl reference electrode until most of the cobalt had been reduced to the $Co^+$ oxidation state as evidenced by a reduction in the amount of current flowing to approximately less than ten percent of the beginning current level. A platinum helix contained in a separate fritted compartment containing methanolic NaI solution was used as the counter electrode.

Seventy-five micron thick strips of an aromatic polyimide (Kapton ®) were immersed in the solution prepared above for about 60 seconds, removed and rinsed in methanol and wiped dry. The resultant deeply green colored polyimide strips were metallized as in Example 1 and as in Example 4, except that it was performed in the absence of oxygen.

EXAMPLE 18

Example 17 was repeated except substituting an equivalent concentration of tetramethyl ammonium bromide for the sodium iodide.

EXAMPLE 19

Preferred example (method) for the deposition of copper with good adhesion.

A solution of 20 millimolar $Co(bpy)_3(NO_3)_2$ in methanol was prepared as in Example 17. The solution was made 0.1 molar in tetramethyl ammonium bromide and then in the absence of oxygen reduced to $Co(bpy)_3 \cdot {}^+NO_3$. Kapton TM film was reduced in this solution for 60 seconds and then rinsed in methanol. The reduced film was then immersed in methanolic copper acetate with a concentration of 0.5 mg/ml. The film was allowed to oxidize for 3 minutes and then rinsed in methanol. The film, now containing a thin copper film was immersed in electroless copper for 1 minute as in Example 4. The film was then rinsed in water. Films prepared in this manner, and subsequently electroplated to 1 mil thickness, yield, through an Institute of Printed Circuitry T peel test, a value of between 5 and 9 lbs/lineal inch.

EXAMPLE 20

Preferred example for the deposition of well adhered copper films.

An aqueous solution 0.02 molar in $VOSO_4$ and 0.1M in ethylenediamine tetracetic acid was prepared and neutralized by the addition of tetramethylammonium hydroxide. The vanadium complex was then electrochemically reduced to $V(II)EDTA^{2-}$ as in Example 8. The pH of the final reduced solution was adjusted with either tetramethylammonium hydroxide or concentrated $H_2SO_4$ to 9. Kapton TM film was reduced in this solution for 60 seconds and then rinsed in deionized water. The reduced film was then oxidized in dilute aqueous cupric oxalate (0.004M–0.005M) for 120 seconds until the film was discharged. The copper coated film was then immersed in electroless copper (Example 4) for 1 minute at 120° F. Films prepared in this manner were electroplated to 1 mil copper thickness. The films were then etched as in Example 5 and tested for adhesion by a standard IPC T peel test. Adhesion values in excess of 6 lbs/linear inch were obtained.

We claim:

1. A process for the deposition of metal layers onto at least one polymeric surface having electroactive sites therein comprising contacting said at least one polymeric surface with a first solution wherein at least 10 molar percent of all negative charge intercalation ions within said first solution are selected from the group consisting of monoatomic ions and complexed transition metals as negative charge intercalation ions and wherein the half-wave potential of said at least 10 molar percent of said negative charge intercalation ions is negative with respect to the half-wave potential of the electroactive sites in said polymer surface, thereby reducing the polymer of said at least one polymeric surface without substantial plating of metal onto said at least one polymeric surface, then contacting said at least one surface of the reduced polymer with a second solution having reducible metal cations therein so that the reduced polymer of said at least one polymeric surface reduces the metallic ion to form metal in a form selected from the group consisting of metal film on said at least one polymer surface and metal particles within said at least one polymer surface.

2. The process of claim 1 wherein said monatomic ions and transition metal complexes as negative charge intercalation ions comprise at least 60 molar percent of all negative charge intercalation ions in said first solution.

3. The process of claim 1 wherein said monoatomic ions and transition metal complexes as negative charge intercalation ions comprise at least 90 molar percent of all negative charge intercalation ions in said first solution.

4. The process of claim 1 wherein said monatomic ions and transition metal complexes as negative charge intercalation ions comprise 100 molar percent of the negative charge intercalation ions in said first solution and said first solution is free of Zintl complexes and Zintl anions.

5. The process of claim 1 wherein said ions are selected from $Te^{2-}$ ions, and Co(I) and V(II) complexes.

6. The process of claim 2 wherein said ions are selected from $Te^{2-}$ ions, and Co(I) and V(II) complexes.

7. The process of claim 3 wherein said ions are selected from Co(I) and V(II) complexes.

8. The process of claim 4 wherein said ions are selected from $Te^{2-}$ ions, and Co(I) and V(II) complexes.

9. The process of claim 1 wherein metal particles are deposited within the polymer of said at least one polymeric surface.

10. The process of claim 9 wherein at least some of said metal particles are deposited at a depth greater than 1 micron.

11. The process of claim 4 wherein metal particles are deposited within the polymer of said at least one polymeric surface.

12. The process of claim 11 wherein at least some of said metal particles are deposited at a depth greater than 1 micron.

13. The process of claim 5 wherein metal particles are deposited within the polymer of said at least one polymeric surface.

14. The process of claim 8 wherein metal particles are deposited within the polymer of said at least one polymeric surface.

15. The process of claim 14 wherein at least some of said metal particles are deposited at a depth greater than 1 micron.

16. The process of claim 1 wherein said polymer of said at least one polymeric surface contains imide electroactive sites.

17. The process of claim 4 wherein said polymer of said at least one polymeric surface contains pyromellitimide electroactive sites.

18. The process of claim 15 wherein said polymer of said at least one polymeric surface contains pyromellitimide electroactive sites.

19. The process of claim 1 wherein said polymer of said at least one polymeric surface contains pyromellitimide electroactive sites.

20. The process of claim 1 wherein said polymer of said at least one polymeric surface comprises polyimide.

21. The process of claim 15 wherein said polymer of said at least one polymeric surface comprises polyimide.

22. The process of claim 1 wherein after at least 25% of the reduced polymer is oxidized by the metallic ion to form metal, a second metallization process is begun.

23. The process of claim 1 wherein after at least 50% of the reduced polymer is oxidized by the metallic ion to form metal, a second metallization process is begun.

24. The process of claim 1 wherein after at least 90% of the reduced polymer is oxidized by the metallic ion to form metal, a second metallization process is begun.

25. The process of claim 1 wherein after substantially all of the reduced polymer is oxidized by the metallic ion to form metal, a second metallization process is begun.

26. The process of claim 5 wherein after at least 25% of the reduced polymer is oxidized by the metallic ion to form metal, a second metallization process is begun.

27. The process of claim 8 wherein after substantially all of the reduced polymer is oxidized by the metallic ion to form metal, a second metallization process is begun.

28. The process of claim 10 wherein after at least 25% of the reduced polymer is oxidized by the metallic ion to form metal, a second metallization process is begun.

29. The process of claim 11 wherein after at least 90% of the reduced polymer is oxidized by the metallic ion to form metal, a second metallization process is begun.

30. The process of claim 15 wherein after substantially all of the reduced polymer is oxidized by the metallic ion to form metal, a second metallization process is begun.

31. The process of claim 16 wherein after at least 25% of the reduced polymer is oxidized by the metallic ion to form metal, a second metallization process is begun.

32. The process of claim 17 wherein after at least 25% of the reduced polymer is oxidized by the metallic ion to form metal, a second metallization process is begun.

33. The process of claim 18 wherein after at least 25% of the reduced polymer is oxidized by the metallic ion to form metal, a second metallization process is begun.

34. The process of claim 16 wherein after at least 90% of the reduced polymer is oxidized by the metallic ion to form metal, a second metallization process is begun.

35. The process of claim 18 wherein after at least 90% of the reduced polymer is oxidized by the metallic ion to form metal, a second metallization process is begun.

36. The process of claim 16 wherein after substantially all of the reduced polymer is oxidized by the metallic ion to form metal, a second metallization process is begun.

37. The process of claim 18 wherein after substantially all of the reduced polymer is oxidized by the metallic ion to form metal, a second metallization process is begun.

38. A process for the deposition of metal layers onto at least one polymeric surface having electroactive sites therein comprising contacting said at least one polymeric surface with a first solution wherein at least 10 molar percent of all negative charge intercalation ions within said first solution are selected from the group consisting of monoatomic ions and complexed transition metals as negative charge intercalation ions and wherein the half-wave potential of said at least 10 molar percent of said negative charge intercalation ions is negative with respect to the half-wave potential of the polymer in said polymer surface, thereby reducing the polymer of said at least one polymeric surface without substantial plating of metal onto said at least one polymeric surface, then contacting said at least one surface of the reduced polymer with a second solution having reducible metal cations therein so that the reduced polymer of said at least one polymeric surface reduces the metallic ion to form metal in a form selected from the group consisting of metal film on said at least one polymer surface and metal particles within said at least one polymer surface, said at least 10 molar percent of said negative charge intercalation ions being exclusive of Zintl complexes and Zintl anions.

39. A process for the deposition of meta layers onto at least one polymeric surface hasving electroactive sites therein comprising contacting said at least one polymeric surface with a first ionic solution wherein the ions are selected from the group consisting of Co(I) and V(II) complexes, thereby reducing the polymer of said at least one polymeric surfaces without substantial plating of metal onto sasid at least one polymeric surace, then contacting said at least one polymeric surface with a second solution having reducible metal cations therein so that the reduced polymer of said at least one polymeric surface reduces the metallic ions tO form metal in a form selected from the group consisting of metal film on said at leat one polymer surface and metal particles within said at least one polymer surface.

* * * * *

UNITED STATES PATENT AND TRADEMARK OFFICE
CERTIFICATE OF CORRECTION

PATENT NO. : 4,710,403
DATED : December 1, 1987
INVENTOR(S) : Krause and Rider

It is certified that error appears in the above-identified patent and that said Letters Patent is hereby corrected as shown below:

Column 3, line 9 "$Co(bipyridyl)_3^{30}$" should be --$Co(bipyridyl)_3^+$--.

Column 4, line 18 "0.1M Kl" should be --0.1M KI--.

Column 11, line 65 "$Co(bpy)_3+NO_3$" should be --$Co(bpy)^+_3NO_3$--.

Column 14, line 53, Claim 39, "meta" should be --metal--.

Column 14, line 54, Claim 39 "hasving" should be --having--.

Column 14, line 60, Claim 39 "sasid" should be --said--.

Column 14, line 64, Claim 39 "tO" should be --to--.

Column 14, line 66, Claim 39 "leat" should be --least--.

Signed and Sealed this

Thirty-first Day of October, 1989

Attest:

DONALD J. QUIGG

*Attesting Officer*

*Commissioner of Patents and Trademarks*